United States Patent
Goyal et al.

(10) Patent No.: US 8,993,092 B2
(45) Date of Patent: Mar. 31, 2015

(54) POLYCRYSTALLINE FERROELECTRIC OR MULTIFERROIC OXIDE ARTICLES ON BIAXIALLY TEXTURED SUBSTRATES AND METHODS FOR MAKING SAME

(75) Inventors: Amit Goyal, Knoxville, TN (US); Junsoo Shin, Brentwood, TN (US)

(73) Assignee: UT-Battelle, LLC, Oak Ridge, TN (US)

(*) Notice: Subject to any disclaimer, the term of this patent is extended or adjusted under 35 U.S.C. 154(b) by 455 days.

(21) Appl. No.: 13/030,260

(22) Filed: Feb. 18, 2011

(65) Prior Publication Data

US 2012/0213964 A1    Aug. 23, 2012

(51) Int. Cl.
| | | |
|---|---|---|
| *B05D 5/12* | (2006.01) | |
| *B32B 9/00* | (2006.01) | |
| *C23C 14/08* | (2006.01) | |
| *C30B 29/24* | (2006.01) | |
| *C30B 23/02* | (2006.01) | |
| *C30B 29/26* | (2006.01) | |
| *H01F 1/40* | (2006.01) | |

(52) U.S. Cl.
CPC ............... *C30B 29/24* (2013.01); *C30B 23/02* (2013.01); *C30B 29/26* (2013.01); *H01F 1/407* (2013.01)
USPC ............................. 428/141; 427/77; 427/529

(58) Field of Classification Search
CPC ...... C23C 14/028; C30B 23/02; C30B 29/16; C30B 29/22; Y10S 428/93
USPC ........................................... 428/141; 505/150
See application file for complete search history.

(56) References Cited

U.S. PATENT DOCUMENTS

| | | |
|---|---|---|
| 5,432,151 A | 7/1995 | Russo et al. |
| 5,650,378 A | 7/1997 | Iijima et al. |
| 5,739,086 A | 4/1998 | Goyal et al. |
| 5,741,377 A | 4/1998 | Goyal et al. |
| 5,846,912 A | 12/1998 | Selvamanickam et al. |
| 5,872,080 A | 2/1999 | Arendt et al. |
| 5,898,020 A | 4/1999 | Goyal et al. |
| 5,958,599 A | 9/1999 | Goyal et al. |
| 5,964,966 A | 10/1999 | Goyal et al. |
| 5,968,877 A | 10/1999 | Budai et al. |
| 6,077,344 A | 6/2000 | Shoup et al. |
| 6,106,615 A | 8/2000 | Goyal et al. |
| 6,114,287 A | 9/2000 | Lee et al. |
| 6,150,034 A | 11/2000 | Paranthaman et al. |
| 6,151,610 A | 11/2000 | Senn et al. |
| 6,156,376 A | 12/2000 | Paranthaman et al. |
| 6,159,610 A | 12/2000 | Paranthaman et al. |
| 6,180,570 B1 | 1/2001 | Goyal |
| 6,214,772 B1 | 4/2001 | Iijima et al. |

(Continued)

OTHER PUBLICATIONS

Bea et al., "Crystallographic, magnetic, and ferroelectric structures of bulk like BiFeO3 thin films," Appl. Phys. Lett. (2008) 93: 072901.

(Continued)

*Primary Examiner* — Maria Veronica Ewald
*Assistant Examiner* — Laura Auer
(74) *Attorney, Agent, or Firm* — Novak Druce Connolly Bove + Quigg LLP

(57) ABSTRACT

A polycrystalline ferroelectric and/or multiferroic oxide article includes a substrate having a biaxially textured surface; at least one biaxially textured buffer layer supported by the substrate; and a biaxially textured ferroelectric or multiferroic oxide layer supported by the buffer layer. Methods for making polycrystalline ferroelectric and/or multiferroic oxide articles are also disclosed.

32 Claims, 4 Drawing Sheets

(56) References Cited

U.S. PATENT DOCUMENTS

| | | |
|---|---|---|
| 6,235,402 B1 | 5/2001 | Shoup et al. |
| 6,261,704 B1 | 7/2001 | Paranthaman et al. |
| 6,270,908 B1 | 8/2001 | Williams et al. |
| 6,331,199 B1 | 12/2001 | Goyal et al. |
| 6,361,598 B1 | 3/2002 | Balachandran et al. |
| 6,375,768 B1 | 4/2002 | Goyal |
| 6,399,154 B1 | 6/2002 | Williams et al. |
| 6,440,211 B1 | 8/2002 | Beach et al. |
| 6,447,714 B1 | 9/2002 | Goyal et al. |
| 6,451,450 B1 | 9/2002 | Goyal et al. |
| 6,468,591 B1 | 10/2002 | Paranthaman et al. |
| 6,486,100 B1 | 11/2002 | Lee et al. |
| 6,537,689 B2 | 3/2003 | Schoop et al. |
| 6,599,346 B2 | 7/2003 | Goyal et al. |
| 6,602,313 B2 | 8/2003 | Goyal et al. |
| 6,607,313 B1 | 8/2003 | Farries et al. |
| 6,607,838 B2 | 8/2003 | Goyal et al. |
| 6,607,839 B2 | 8/2003 | Goyal et al. |
| 6,610,413 B2 | 8/2003 | Goyal et al. |
| 6,610,414 B2 | 8/2003 | Goyal et al. |
| 6,632,539 B1 | 10/2003 | Iijima et al. |
| 6,635,097 B2 | 10/2003 | Goyal et al. |
| 6,645,313 B2 | 11/2003 | Goyal et al. |
| 6,663,976 B2 | 12/2003 | Beach et al. |
| 6,670,308 B2 | 12/2003 | Goyal |
| 6,675,229 B1 | 1/2004 | Bruno et al. |
| 6,716,795 B2 | 4/2004 | Norton et al. |
| 6,740,421 B1 | 5/2004 | Goyal |
| 6,756,139 B2 | 6/2004 | Jia et al. |
| 6,764,770 B2 | 7/2004 | Paranthaman et al. |
| 6,782,988 B2 | 8/2004 | Cantacuzene et al. |
| 6,784,139 B1 | 8/2004 | Sankar et al. |
| 6,790,253 B2 | 9/2004 | Goyal et al. |
| 6,797,030 B2 | 9/2004 | Goyal et al. |
| 6,846,344 B2 | 1/2005 | Goyal et al. |
| 6,884,527 B2 | 4/2005 | Groves et al. |
| 6,890,369 B2 | 5/2005 | Goyal et al. |
| 6,899,928 B1 | 5/2005 | Groves et al. |
| 6,902,600 B2 | 6/2005 | Goyal et al. |
| 6,921,741 B2 | 7/2005 | Arendt et al. |
| 6,994,775 B2 | 2/2006 | Holesinger et al. |
| 7,087,113 B2 | 8/2006 | Goyal |
| 7,090,785 B2 | 8/2006 | Chiang et al. |
| 7,736,761 B2 | 6/2010 | Foltyn et al. |
| 2002/0144838 A1* | 10/2002 | Fritzemeier et al. ....... 174/125.1 |
| 2004/0018394 A1* | 1/2004 | Jia et al. ........................ 428/701 |
| 2007/0026248 A1* | 2/2007 | Paranthaman et al. ....... 428/469 |
| 2007/0029592 A1* | 2/2007 | Ramesh ...................... 257/295 |
| 2009/0280355 A1 | 11/2009 | Eom et al. |
| 2010/0123368 A1 | 5/2010 | Fujii et al. |
| 2010/0167084 A1 | 7/2010 | Bhattacharya et al. |

OTHER PUBLICATIONS

Dawley and Clem, "Dielectric properties of random and 100 oriented SrTiO3 and (Ba,Sr)TiO3 thin films fabricated on 100 nickel tapes," Appl. Phys. Lett. (2002) 81: 3028.

Dekkers et al., "Ferroelectric properties of epitaxial Pb(Zr,Ti)O3 thin films on silicon by control of crystal orientation," Appl. Phys. Lett. (2009) 95: 012902.

Dimos et al., "Superconducting transport properties of grain boundaries in YBa$_2$Cu$_3$O$_7$ bicrystals," Phys. Rev. B (1990) 41: 4038-4049.

Goyal et al., "High critical current density superconducting tapes by epitaxial deposition of YBa2Cu3Ox thick films on Biaxially textured metals," Appl. Phys. Lett. (1996) 69: 1795-1797.

Goyal et al., "Conductors with controlled grain boundaries: An approach to the next generation, high temperature superconducting wire," J. of Materials Research (1997) 12: 2924-2940.

Goyal, "Epitaxial superconductors on rolling-assisted-biaxially-textured-substrates (RABiTS)," Second Generation HTS Conductors, Kluwer Academic Publishers (2005) Ch. 2: 29-46.

Ihlefeld et al., "Copper compatible barium titanate thin films for embedded passives," J. Electroceram. (2005) 14: 95-102.

Jesse et al., "Switching spectroscopy piezoresponse force microscopy of ferrelectric materials," Appl. Phys. Lett. (2006) 88: 062908.

Kalinin et al., "Quantitative determination of tip parameters in piezoresponse force microscopy," Appl. Phys. Lett. (2007) 90: 212905.

Kingon and Srinivasan, "Lead zirconate titanate thin films directly on copper electrodes for ferroelectric, dielectric and piezoresponse applications," Nat. Mater. (2005) 4: 233-237.

Lebeugle et al., "Very large spontaneous electric polarization in BiFeO3 single crystals at room temperature and its evolution under cycling fields," Appl. Phys. Lett. (2007) 91: 022907.

Lee et al., "Highly (110)- and (111)-oriented BiFeO3 films on BaPbO3 electrode with Ru or Pt/Ru barrier layers," Appl. Phys. Lett. (2007) 90: 182909.

Li et al., "Dramatically enhanced polarization in (001), (101), and (111) BiFeO3 thin films due to epitaxial-induced transitions," Appl. Phys. Lett. (2004) 84: 5261.

Paranthaman et al., "Growth of YBCO films on MgO-based rolling-assisted biaxially textured substrates templates," Supercond. Sci. Technol. (2005) 18: 223-228.

Shin et al., "Single-crystal-like, c-axis oriented BaTiO3 thin films with high-performance on flexible metal templates for ferroelectric applications," Appl. Phys. Lett. (2009) 94: 252903.

Singh et al., "Epitaxial BiFeO3 thin films fabricated by chemical solution deposition," Appl. Phys. Lett. (2006) 88: 162904.

Wang et al., "Epitaxial BiFeO$_3$ multiferroic thin film heterostructures," Science (2003) 299: 1719-1722.

* cited by examiner

POLYCRYSTALLINE FERROELECTRIC OR MULTIFERROIC OXIDE ARTICLES ON BIAXIALLY TEXTURED SUBSTRATES AND METHODS FOR MAKING SAME

STATEMENT REGARDING FEDERALLY SPONSORED RESEARCH OR DEVELOPMENT

This invention was made with government support under DE-AC05-00OR22725 awarded by the United States Department of Energy. The Government has certain rights in the invention.

FIELD OF THE INVENTION

This invention relates to ferroelectric or multiferroic articles, and methods for making the same.

BACKGROUND OF THE INVENTION

Multiferroic $BiFeO_3$ thin films have been extensively investigated because they have a very large remnant polarization and also exhibit the coexistence of ferroelectric and magnetic ordering. Wang J et al, 2003 *Science* 299, 1719. In bulk form, $BiFeO_3$ is a rhombohedrally distorted perovskite structure with space group R3c, with a polarization P~100 $\mu C/cm^2$ along the [111] direction. Lebeugle D, Colson D, Forget A, and Viret M, 2007 *Appl. Phys. Lett.* 91, 022907. For most ferroelectric applications, high quality $BiFeO_3$ thin films are required for fabrication of electronic devices. Such films are typically grown on single-crystal ceramic substrates. Such substrates have the disadvantages of expensive cost, rigidity and availability in only very limited sizes. It is desirable to be able to grow $BiFeO_3$ films on very low-cost, wide-area, long-length, flexible substrates and still be able to manipulate the orientation and hence the polarization of the films.

Recently, the fabrication of three differently oriented, single-crystal, epitaxial $BiFeO_3$ thin films was successfully accomplished via epitaxial growth on (111)-, (101)-, and (001)-oriented $SrTiO_3$ substrates. Li J, Wang J, Wuttig M, Ramesh R, Wang N, Ruette B, Pyatakov A P, Zvezdin A K, and Viehland D, 2004 *Appl. Phys. Lett.* 84, 5261; Singh S K, Kim Y K, Funakubo H, and Ishiwara H, 2006 *Appl. Phys. Lett.* 88, 162904; Bea H, Bibes M, Zhu X-H, Fusil S, Bouzehouane K, Petit S, Kreisel J, and Barthelemy A, 2008 *Appl. Phys. Lett.* 93, 072901.

Growth of $BiFeO_3$ films with different orientations was also reported on the Si substrates. This report demonstrated the growth of (110)- or (111)-oriented polycrystalline $BiFeO_3$ on Si (001) substrates using different choices of barrier layers. Lee C C, Wu J M, and Hsiung C P, 2007 *Appl. Phys. Lett.* 90, 182909. A few groups have successfully deposited paraelectric/ferroelectric thin films on flexible metallic tapes. Dawley J T and Clem P G, 2002 *Appl. Phys. Lett.* 81, 3028; Ihlefeld J, Laughlin B, Hunt-Lowery A, Borland W, Kingon A, and Maria J-P, 2005 *J. Electroceram.* 14, 95; Kingon A I and Srinivasan S, 2005 *Nat. Mater.* 4, 233; Shin J, Goyal A, Jesse S, and Kim D H, 2009 *Appl. Phys. Lett.* 94, 252903.

The direct deposition of highly oriented perovskite-type $BiFeO_3$ ferroelectric thin films on technologically important metallic substrates is complicated by the presence of an oxidizing growth environment at elevated temperature, which needs an oxygen diffusion barrier between ferroelectric films and metallic substrates. Moreover, there exists a large lattice mismatch between ferroelectric materials and metallic tapes.

Several techniques have been developed in the field of superconductors to fabricate wires or tapes wherein grain alignment is produced. Of particular note is the epitaxial growth of superconductors on such ordered substrates as the Rolling-Assisted-Biaxially-Textured-Substrates (RABiTS). RABiTS substrates typically include a textured metal underlayer (for example, nickel or nickel alloy) and an epitaxial buffer layer (for example, $Y_2O_3$ and/or yttria-stabilized zirconia, YSZ, and/or cerium oxide, $CeO_2$). Epitaxial superconductors on biaxially-textured substrates have significantly improved critical current densities of high temperature superconductor tapes, and thus, improved suitability for commercial applications.

SUMMARY OF THE INVENTION

A polycrystalline ferroelectric or multiferroic oxide article comprises a substrate having a biaxially textured surface, at least one biaxially textured buffer layer supported by the substrate; and, a biaxially textured, ferroelectric or multiferroic oxide layer supported by the buffer layer.

The biaxially textured multiferroic oxide layer can comprise at least one selected from the group consisting of multiferroic rare-earth manganites and ferrites and bismuth ferrites and manganites. The biaxially textured multiferroic oxide layer can comprise at least one selected from the group consisting of $TbMnO_3$, $HoMn_2O_5$, $LuFe_2O_4$, $BiFeO_3$ and $BiMnO_3$. The biaxially textured ferroelectric layer can comprise at least one selected from the group consisting of $BaTiO_3$, $PbTiO_3$, (PZT), and (PLZT).

The article can further comprise a conducting layer in contact with the biaxially textured ferroelectric or multiferroic oxide layer. The conducting layer can be $SrRuO_3$. In one aspect, the ferroelectric layer is $BiFeO_3$ and is supported by the $SrRuO_3$ layer, and the $SrRuO_3$ layer is supported by the buffer layer. The orientation of the ferroelectric or multiferroic oxide layer can be selected from the group consisting of (111), (101), and (001).

The buffer layer can comprise $Y_2O_3$. A YSZ layer can be supported on the $Y_2O_3$ layer. A $CeO_2$ layer can be supported on the YSZ layer. A $BiFeO_3$ seed layer can be supported on the $CeO_2$ layer. The buffer layer can comprise MgO.

The article can be a high-density flexible data storage, an actuator, a switch, or a magnetic field sensor. Other devices are possible. The article can be non-volatile memory.

The substrate can be a RABiTS substrate. The substrate can be an ion beam assisted deposition (IBAD) substrate. The substrate can be an inclined-substrate deposition (ISD) substrate.

A method for making a polycrystalline ferroelectric and/or multiferroic oxide article can comprise the steps of providing a substrate having a biaxially textured surface; depositing at least one biaxially textured buffer layer such that the buffer layer is supported by the substrate; and depositing a biaxially textured ferroelectric or multiferroic oxide layer on the buffer layer.

The biaxially textured multiferroic oxide layer can comprise at least one selected from the group consisting of multiferroic rare-earth manganites and ferrites and bismuth ferrites and manganites. The biaxially textured multiferroic oxide layer comprises at least one selected from the group consisting of $TbMnO_3$, $HoMn_2O_5$, $LuFe_2O_4$, $BiFeO_3$, and $BiMnO_3$. The biaxially textured ferroelectric layer can comprise at least one selected from the group consisting of $BaTiO_3$, $PbTiO_3$, (PZT), and (PLZT). The method can further comprise the step of depositing a conducting layer that is in contact with the ferroelectric or multiferroic oxide layer.

A conducting layer can be deposited to be supported by the ferroelectric or multiferroic oxide layer. The conducting layer can be $SrRuO_3$. Other materials for the conducting layer are possible.

The substrate can be formed by a RABiTS process. The substrate can alternatively be formed by ion beam assisted deposition (IBAD) process or by an inclined-substrate deposition (ISD) process.

In one embodiment, a buffer layer is deposited on the substrate and an $SrRuO_3$ layer is deposited such that the $SrRuO_3$ is supported by the buffer layer. A top layer of biaxially textured $BiFeO_3$ is then deposited such that the $BiFeO_3$ is supported by the $SrRuO_3$ layer.

BRIEF DESCRIPTION OF THE DRAWINGS

A fuller understanding of the present invention and the features and benefits thereof will be obtained upon review of the following detailed description together with the accompanying drawings, in which.

DETAILED DESCRIPTION OF THE INVENTION

Figure 1:
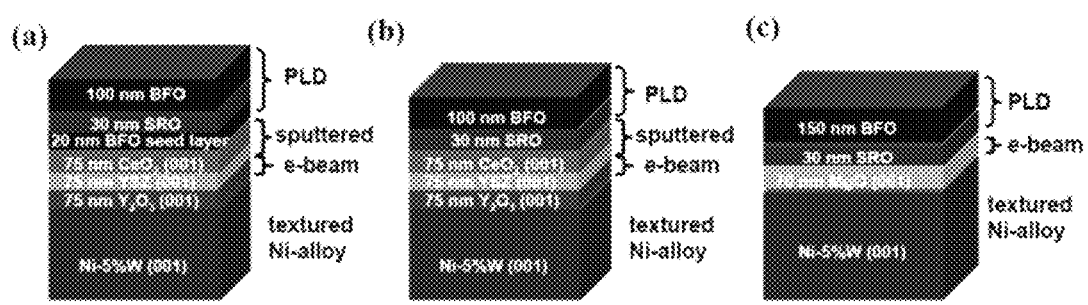
FIG. 1 is a schematic cross-section of the multilayer structure (a) (111)-oriented polycrystalline $BiFeO_3$ films (sample A); (b) (101)-oriented polycrystalline $BiFeO_3$ films (sample B); and (c) (001)-oriented polycrystalline $BiFeO_3$ films (sample C).

A polycrystalline ferroelectric or multiferroic article according to the invention includes a substrate having a biaxially textured surface; at least one biaxially textured buffer layer supported by the substrate; and a top layer of a biaxially textured ferroelectric or multiferroic oxide material supported by the buffer layer.

The biaxially textured ferroelectric oxide layer can be selected from many suitable ferroelectric or multiferroic oxide materials. The growth of highly oriented polycrystalline or epitaxial ferroelectric/mutiferroic oxide layers on biaxially textured flexible substrates could be limited to ferroelectric/mutiferroic materials with perovskite structure such as Barium Titanate ($BaTiO_3$), Lead Titanate ($PbTiO_3$), Lead Zirconate Titanate (PZT), Lead Lanthanum Zirconate Titanate (PLZT), Lead Magnesium Niobate (PMN), Potassium Niobate ($KNbO_3$), Potassium Sodium Niobate ($K_xNa_{1-x}NbO_3$), Potassium Tantalate Niobate ($K(Ta_xNb_{1-x})O_3$), rare-earth manganates and ferrites ($TbMnO_3$, $HoMn_2O_5$, $LuFe_2O_4$), and bismuth compounds ($BiFeO_3$, $BiMnO_3$).

Examples of suitable materials include perovskite transition metal oxides, and include rare-earth manganates and ferrites such as $TbMnO_3$, $HoMn_2O_5$, $LuFe_2O_4$, and bismuth compounds $BiFeO_3$ and $BiMnO_3$. Examples of ferroelectric materials include barium titanate ($BaTiO_3$), lead titanate, $PbTiO_3$, lead zirconate titanate (PZT), and lead lanthanum zirconate titanate (PLZT). There are many other oxide compounds which are ferroelectric, and which would be suitable for use with the invention.

Multiferroics have been formally defined as materials that exhibit more than one primary ferroic order parameter simultaneously (i.e. in a single phase). The four basic primary ferroic order parameters are ferromagnetism, ferroelectricity, ferroelasticity and ferrotoroidicity, the latter still being under debate. However, many researchers in the field consider materials as multiferroics only if they exhibit coupling between the order parameters. On the other hand, the definition of multiferroics can be expanded as to include non-primary order parameters, such as antiferromagnetism or ferrimagnetism.

Typical multiferroics belong to the group of the perovskite transition metal oxides, and include rare-earth manganites and -ferrites such as $TbMnO_3$, $HoMn_2O_5$, $LuFe_2O_4$. Other examples are the bismuth compounds $BiFeO_3$ and $BiMnO_3$. Other multiferroic oxide materials are possible. These alloys show rich phase diagrams combining different ferroic orders in separate phases. Apart from single phase multiferroics, composites and heterostructures exhibiting more than one ferroic order parameter are studied extensively. Some examples include magnetic thin films on piezoelectric PMN-PT substrates and Metglass/PVDF/Metglass trilayer structures. Besides scientific interest in their physical properties, multiferroics have potential for applications as actuators, switches, magnetic field sensors or new types of electronic memory devices. The orientation of the $BiFeO_3$ can be selected from the group consisting of (111), (101), and (001).

One or more additional layers can be provided. The additional layers can also be biaxially textured. In one aspect, a conducting layer can be interposed between the buffer layer and the ferroelectric layer. The conducting layer can be any suitable material. A suitable material for the conducting layer is $SrRuO_3$.

As used herein, "supported on" refers to a layer that is above another layer, while "deposited on" refers to a layer that is above and in physical contact with another layer. A layer that is "supported on" may or may not be in physical contact with the other layer.

The buffer layer can be selected from a number of suitable buffer layer materials. The buffer layer can comprise $Y_2O_3$. A YSZ layer can be supported on the $Y_2O_3$ layer. A $CeO_2$ layer can be supported on the YSZ layer. A $BiFeO_3$ seed layer can be supported on the $CeO_2$ layer. In one embodiment, a YSZ layer is deposited on the $Y_2O_3$ layer, a $CeO_2$ layer is deposited on the YSZ layer, and the $BiFeO_3$ seed layer can be deposited on the $CeO_2$ layer.

Other buffer layer materials are possible. Some examples of other suitable buffer layer materials include $(RE)_2O_3$, where RE is rare earth, $LaM'O_3$, wherein M' is a transition or main group metal (e.g., $LaAlO_3$, $LaGaO_3$, $LaMnO_3$, $LaCrO_3$, $LaNiO_3$), lanthanum zirconate (e.g., $La_2Zr_2O_7$), $SrTiO_3$ (and its Nb-doped analog), $NdGaO_3$, $NbTiO_3$, MgO, TiN, $TiB_2$, Pd, Ag, Pt, and Au.

The architecture of the buffer layer can vary. Some common RABiTS architectures include, for example, a four-layer architecture, such as $CeO_2$/YSZ/$Y_2O_3$/Ni/Ni—W, and a three-layer architecture, such as $CeO_2$/YSZ/$CeO_2$/Ni—W. A $CeO_2$/YSZ/$Y_2O_3$/Ni-3 at % W architecture was used in the examples herein.

A method for making a ferroelectric and/or multiferroic article includes the steps of a) providing a substrate having a biaxially textured surface; b) depositing at least one biaxially textured buffer layer such that the buffer layer is supported by the substrate; and c) depositing a biaxially textured ferroelectric or multiferroic oxide layer so as to be supported on the buffer layer. A biaxially textured conducting layer such as SrRuO$_3$ can be deposited such that the SrRuO$_3$ is supported by the buffer layer and is in contact with the ferroelectric or multiferroic oxide layer.

The manner of deposition of the layers can vary. The BiFeO$_3$ and SrRuO$_3$ films can be deposited by suitable methods such as pulsed laser deposition (PLD). Other physical vapor deposition methods such as sputtering and electron beam PVD can be used. Sputtering can be used to deposit CeO$_2$ and YSZ. Electron beam PVD can be used to deposit Y$_2$O$_3$ and MgO. Other suitable chemical deposition methods include chemical vapor deposition (CVD), metal organic chemical vapor deposition (MOCVD) and chemical solution methods such as metallorganic decomposition (MOD) and sol-gel The invention can be used to form many different ferroelectric and/or multiferroic articles. Such articles include high-density flexible data storage devices and non-volatile memory devices. Other articles can also be made.

The biaxially textured ferroelectric or multiferroic oxide film can be supported on or deposited on any of several suitable substrates known in the art. The primary substrate considered herein possesses an ordered (i.e., typically, biaxially-textured) surface upon which the phase-separated layer is deposited. For example, any of the biaxially-textured substrates known in the art can be used as the primary substrate on which the phase-separated layer is deposited. The term "biaxially-textured substrate" as used herein is meant to be synonymous with the related term "sharply biaxially-textured substrate." By one definition, a biaxially-textured substrate is a polycrystalline substrate wherein the grains are aligned within a specific angular range with respect to one another, as would generally be found on the surface of a bulk single crystal. A polycrystalline material having biaxial texture of sufficient quality for the invention can be generally defined as having an x-ray diffraction phi scan peak of no more than 20° full-width-half-maximum (FWHM) and an omega-scan of 10° FWHM. The X-ray phi-scan and omega-scan measure the degree of in-plane and out-of-plane texture, respectively. An example of biaxial texture is the cube texture with orientation {100}<100>, wherein the (100) crystallographic plane of all grains is parallel to the substrate surface and the [100] crystallographic direction is aligned along the substrate length.

Other suitable definitions can also be used for defining a biaxially-textured substrate. For example, a biaxially-textured substrate can be defined as a substrate having a crystallographic orientation such that the substrate possesses a FWHM within 7°, preferably within 5°, and more preferably within 3° throughout the crystal. Furthermore, the biaxially-textured substrate need not be polycrystalline (i.e., multi-grained), but may be single-crystalline (i.e., single-grained).

Several types of biaxially-textured substrates are known, all of which are suitable for the purposes herein. These include ion beam assisted deposition (IBAD) and inclined substrate deposition (ISD) techniques. A class of primary substrates suitable for use herein is the class of rolling assisted, biaxially-textured substrates (RABiTS). The RABiTS method produces a polycrystalline substrate having primarily low angle grain boundaries. Further details of the RABiTS technique and formed substrates can be found in, for example, A. Goyal, et al., *J. of Materials Research*, vol. 12, pgs. 2924-2940, 1997, and D. Dimos et al., *Phys. Rev. B,* 41:4038-4049, 1990.

The RABiTS technique provides a simple method for fabricating long lengths of biaxially-textured substrates with primarily low-angle grain boundaries. These substrates have been widely employed for the epitaxial deposition of high temperature superconducting (HTS) materials. A number of U.S. patents directed to the RABiTS process and related process variants have been issued. These include U.S. Pat. Nos. 5,739,086; 5,741,377; 5,846,912; 5,898,020; 5,964,966; 5,958,599; 5,968,877; 6,077,344; 6,106,615; 6,114,287; 6,150,034; 6,156,376; 6,151,610; 6,159,610; 6,180,570; 6,235,402; 6,261,704; 6,270,908; 6,331,199; 6,375,768; 6,399,154; 6,451,450; 6,447,714; 6,440,211; 6,468,591; 6,486,100; 6,599,346; 6,602,313; 6,607,313; 6,607,838; 6,607,839; 6,610,413; 6,610,414; 6,635,097; 6,645,313; 6,537,689; 6,663,976; 6,670,308; 6,675,229; 6,716,795; 6,740,421; 6,764,770; 6,784,139; 6,790,253; 6,797,030; 6,846,344; 6,782,988; 6,890,369; 6,902,600; and 7,087,113.

In a preferred embodiment, a RABiTS substrate is prepared generally as follows. Briefly, a deformed metal substrate with a very well-developed copper-type (Cu-type) rolling texture is first provided. The metal can be any suitable metal, and typically a FCC type of metal (e.g., Cu, Co, Mo, Cd, Pd, Pt, Ag, Al, Ni, and their alloys), and more preferably, nickel and its alloys such as NiW. A substrate with a Cu-type rolling texture can be readily identified, as known in the art, and as disclosed in, for example, U.S. Pat. No. 7,087,113. For example, a Cu-type rolling texture generally exhibits the characteristic that the X-ray intensity in the pole figures is concentrated on the β-fiber in Euler space of orientation representation. In other words, a Cu-type rolling texture is generally characterized by an orientation of all the grains in the material lying on the β-fiber. The β-fiber is defined as the tube or fiber running from the B through the S to the C point in Euler space. Cu-type rolling texture is generally best shown using pole figures of (111), (200), and (220) from the substrate or drawing the orientations in Euler Space. Next, the metal with Cu-type rolling texture is annealed at a temperature higher than its secondary recrystallization temperature to provide exaggerated grain growth such that a single grain consumes other grains to form an essentially single crystalline (i.e., single grain) type of material (hereinafter, a "single crystal substrate").

Another type of biaxially-textured substrate includes the ion-beam-assisted deposition (IBAD) substrate. IBAD processes and resulting substrates are described in, for example, U.S. Pat. Nos. 6,632,539, 6,214,772, 5,650,378, 5,872,080, 5,432,151, 6,361,598, 5,872,080, 6,756,139, 6,884,527, 6,899,928, and 6,921,741, the disclosures of which are incorporated herein by reference in their entireties. Typically, an IBAD substrate is characterized by an MgO layer (i.e., "IBAD-MgO") biaxially grown using ion assist on an Al$_2$O$_3$/Y$_2$O$_3$-coated polycrystalline nickel-based alloy (generally, Hastelloy) base substrate. The Hastelloy substrate is typically deposited on a polycrystalline copper layer. The Al$_2$O$_3$ layer serves primarily as a barrier to prevent upward diffusion of substrate components (i.e., functions as a diffusion barrier layer) while the Y$_2$O$_3$ layer serves as a seed layer for the IBAD-MgO nucleation. Often, a homo-epitaxial MgO (i.e., homo-epi MgO) layer is epitaxially grown on the IBAD-MgO layer to improve the texture of the IBAD-MgO layer. A texture-transferring capping layer, typically a perovskite layer, such as LaMnO$_3$ (LMO), SrRuO$_3$, or SrTiO$_3$ (but, more typically, LMO) is deposited on the homo-epi MgO layer, or directly on the IBAD-MgO layer. The texture-transferring layer functions to transfer the texture of the MgO layer to the next deposited layer, i.e. the ferroelectric and/or multiferroic layer, wherein the deposited layer is generally deposited on the capping perovskite layer. An exemplary and widely used IBAD architecture is Al$_2$O$_3$/Y$_2$O$_3$/IBAD-MgO/homo-epi MgO/LMO.

Yet another type of biaxially-textured substrate includes the inclined-substrate deposition (ISD) substrate. In the ISD process, the resulting substrate has rotated cube texture and the rotation can be as high as 40-45°. ISD processes and resulting substrates are described in, for example, U.S. Pat. Nos. 6,190,752 and 6,265,353, the disclosures of which are incorporated herein by reference in their entireties. In both the IBAD and ISD processes, a biaxially-textured layer is deposited on a flexible, polycrystalline, untextured substrate.

Typically, at least one buffer layer is epitaxially deposited on the surface of the single crystal substrate. The function of the buffer layer is typically as a chemical barrier between the single crystal substrate and the superconducting layer, thereby preventing reaction between these layers while epitaxially transmitting the ordered crystalline structure of the single crystal substrate to the superconducting layer.

EXAMPLES

Highly oriented, polycrystalline $BiFeO_3$ films were grown on rolling-assisted biaxially textured substrates (RABiTS) with a 30 nm thick $SrRuO_3$ as a bottom electrode. The (111)- and (101)-oriented $BiFeO_3$ films with 100 nm thickness were deposited by pulsed laser deposition (PLD) with a KrF laser (=248 nm) at a repetition rate of 10 Hz on $SrRuO_3$-covered RABiTS which have the configuration $CeO_2$/YSZ/$Y_2O_3$/Ni-3 at % W as used in superconductor applications [FIG. 1 (a) and (b)—identified as samples A and B]. In order to grow (111)-oriented $BiFeO_3$ films, a 20 nm thick $BiFeO_3$ seed layer was deposited followed by the $SrRuO_3$ layer [FIG. 1 (a)]. A 150 nm thick (001)-oriented $BiFeO_3$ film with a $SrRuO_3$ bottom electrode was deposited by PLD on biaxially textured Ni-3 at % W tape, with an epitaxial MgO layer for oxygen diffusion barrier grown by electron beam evaporation [FIG. 1 (c)—identified as sample C]. All $BiFeO_3$ and $SrRuO_3$ films by PLD were grown at 700° C. in 100 mTorr $O_2$ with a laser energy density of ~2 $J/cm^2$.

The crystallographic structure and orientation of the samples was characterized by XRD (Picker four-circle diffractometer). The polarization domain orientation and imaging of highly oriented $BiFeO_3$ films was studied by vertical and lateral PFMs. Ferroelectric switching of the local polarization was quantitatively investigated by SS-PFM for each oriented $BiFeO_3$ film. The PFM and SS-PFM procedures were performed with Au—Cr coated Si tips with a spring constant k~0.65 N/m. The PFM images were acquired using a modulation voltage of 3 $V_{p-p}$ at a frequency of 400 kHz.

Figure 2:
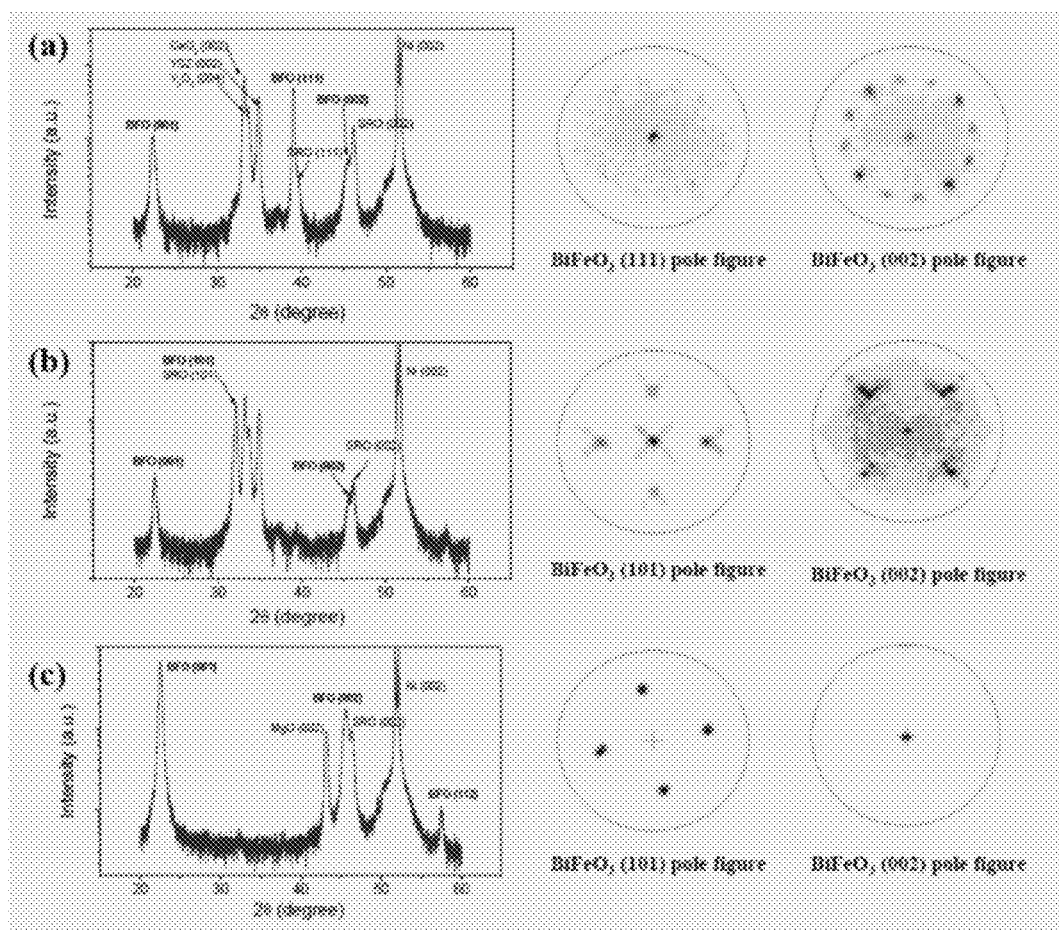
FIG. 2 are x-ray diffraction (XRD) θ-2θ scans and pole figures of $BiFeO_3$ thin films on textured Ni—W substrates for: (a) sample A, (b) sample B, and (c) sample C.

To investigate the crystallographic orientation and phase of the $BiFeO_3$ films (sample A, B, and C), XRD 0-20 scan and pole figures were obtained. FIG. 2 (a, left) shows a highly (111) oriented $BiFeO_3$ film (sample A) with weak (00l) peaks. As shown in FIG. 2 (a, right), two pole figures of the $BiFeO_3$ (111) and (002) reflection recorded from sample A revealed the presence of twelve-fold in-plane symmetry: three-fold from the films and four-fold from the substrate. For each (111) orientation, there are three spots in the (200) pole figure. The twelve spots in FIG. 2(a) correspond to four in-plane orientations separated by 90° (or, equivalently, 30°). FIG. 2 (b, left) shows highly (101)-oriented $BiFeO_3$ films (sample B) with weak (00l) peaks. The two pole figures of the $BiFeO_3$ (101) and (002) reflection recorded from sample B [FIG. 2 (b, right)] show two in-plane orientations. For each (110) orientation, there are two spots in the (200) pole figure. The four spots in FIG. 2(b) correspond to two in-plane orientations separated by 90°. Finally, FIG. 2 (c, left) shows highly (001)-oriented $BiFeO_3$ films (sample C) with a very weak $BiFeO_3$ (112) peak. Pole figures of the $BiFeO_3$ (101) and (002) reflection recorded from sample C support that this sample has grown with standard cube-on-cube epitaxy with four-fold symmetry.

Figure 3:
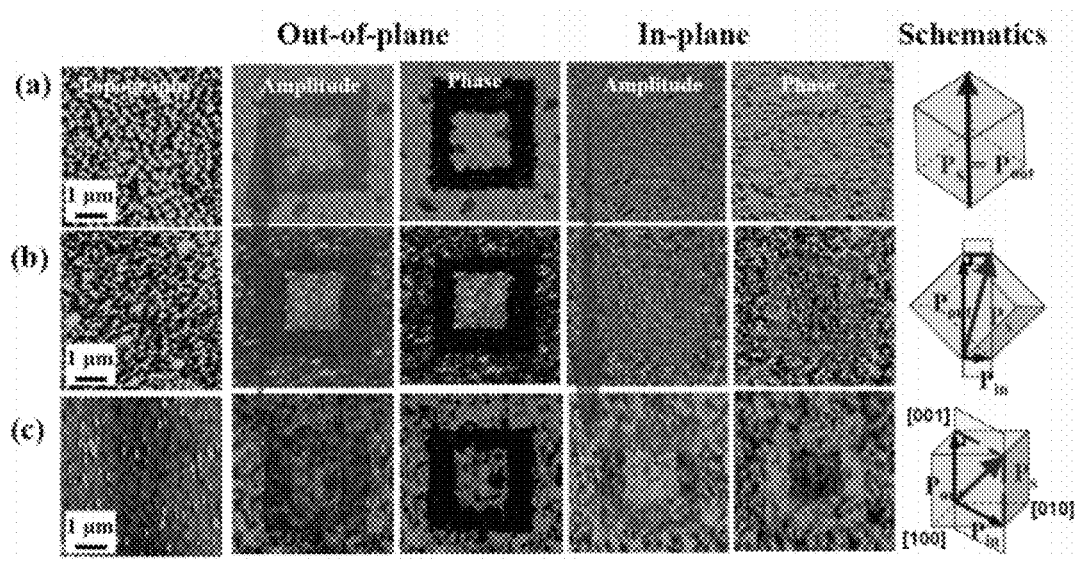
FIG. 3 depicts the results of piezoresponse force microscopy (PFM) for surface topography and amplitudes and phases of vertical PFM (out-of-plane) and lateral PFM (in-plane) images of the $BiFeO_3$ film with schematics of the polarization projections corresponding to (a) sample A, (b) sample B, and (c) sample C. The z-scales in topography are (a) 200, 150, and 100 nm for sample A, B, and C.

Highly oriented (111)-, (101)-, and (001)-$BiFeO_3$ thin films show clear and well-defined ferroelectric properties as shown in FIG. 3. Strong ferroelectric responses were obtained from each of the films using piezoresponse force microscopy (PFM). The electrical poling was performed by scanning the probe at a bias of −10 V over a 3×3 $\mu m^2$ followed by scanning at a bias of +10 V over 1.5×1.5 $\mu m^2$. In PFM, the tip, biased with $V_{tip}=V_{dc}+V_{ac}\cos(\omega t)$, is brought into contact with the surface, and the electromechanical response of the surface is detected as the first harmonic component of the bias-induced tip deflection, $d=d_0+d_{1\omega}\cos(\omega t+\phi)$. The PFM signal is plotted as a pair of amplitude-phase ($A=d_{1\omega}/V_{ac}$ and $\phi$) images. The deflection amplitude, A, is determined by the tip motion and the phase, $\phi$, yields information on the polarization direction below the tip. FIG. 3 shows topography, PFM amplitude and phase images for the vertical (out-of-plane) and lateral (in-plane) PFM domain structure in sample A, B, and C. The topographical images show irregularly shaped grains with root-mean-square roughness of ~33 nm, ~19 nm, and ~15 nm for sample A, B, and C, respectively. As shown in FIG. 3 (c), sample C exhibits a relatively strong in-plane component of polarization by lateral PFM image as well as out-of-plane component by vertical PFM, indicating the observation of polarization along both the [100] and [001] direction ($P_{100}$ and $P_{001}$). This can be interpreted as projections of the polarization along the (111) direction, $P_{111}$, in this (001) oriented film. Sample B has weaker in-plane polarization as shown in FIG. 3 (b) than that of sample C due to weaker projection of $P_{101}$ (<$P_{111}$) to the in-plane direction. However, sample A has almost no in-plane component of PFM image [FIG. 3 (a)], indicating that (111)-oriented $BiFeO_3$ poly-crystalline films show only an out-of-plane component of polarization. No observation of in-plane domain structure in sample A also indicates that (111)-oriented $BiFeO_3$ films have polarization oriented only along the normal <111> direction rather than along non-normal <111>-type directions such as [11-1], [-11-1], and [1-1-1], resulting in the observation of a maximized polarization in this sample. The projections of the in-plane and out-of-plane polarizations as expected are shown schematically on the right of FIG. 3 (a-c). The observations of polarization are consistent with what is expected given the orientation of the film and the expected projections of the polarization along in-plane and out-of-plane.

Figure 4:
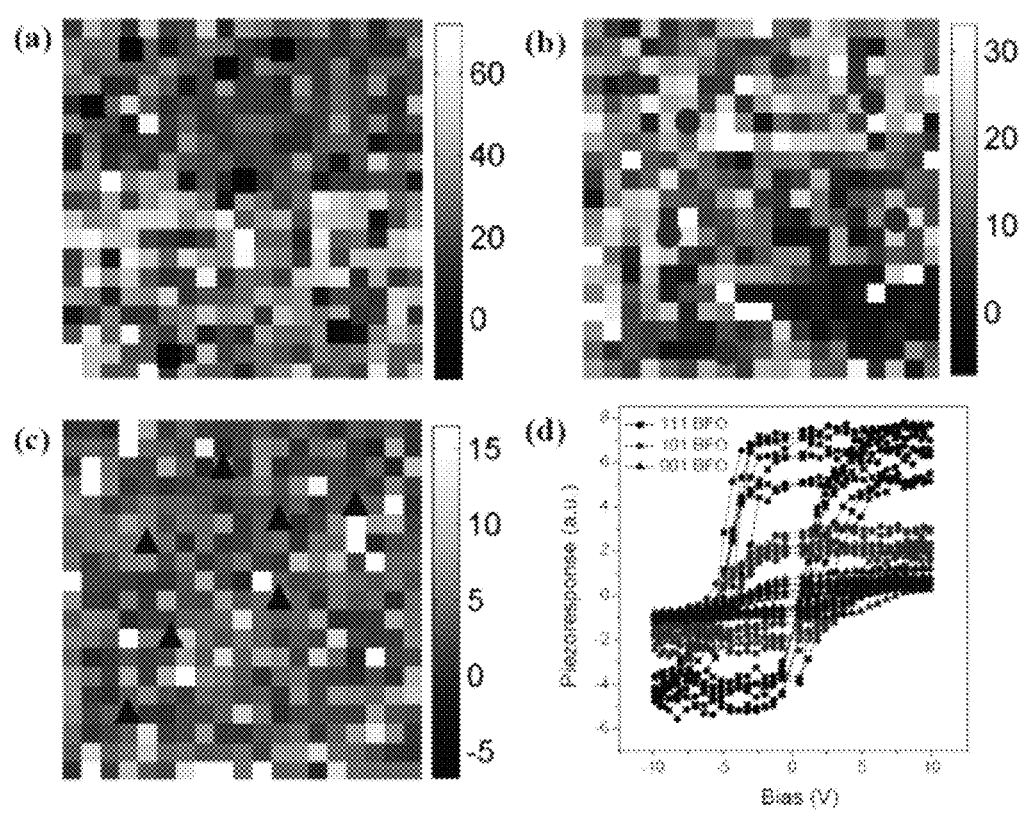
FIG. 4 are switching spectroscopy PFM (SS-PFM) maps for (a) sample A, (b) sample B, and (c) sample C. (d) Representative hysteresis loops from regions are indicated in (a-c).

To quantitatively compare the magnitude of out-of-plane domain structure for each sample, SS-PFM for all samples was performed using a probe with the same geometry and conditions. All measurements were made with the same tip having the same effective tip parameters and tip-surface contact which influence the shape of hysteresis loops. SS-PFM includes the acquisition and analysis of local hysteresis loops at every point in the specified grid to extract the switching parameters from the loops. These are then plotted as two-dimensional maps. FIG. 4 (a-c) show SS-PFM maps of "work of switching" (defined as the area of each loop) for a 2×2 $\mu m^2$ region, corresponding to 20×20 pixels at 100 nm pitch. The work of switching of overall SS-PFM maps [FIG. 4 (a-c)] demonstrates that sample A displays the largest loop area and sample C displays the smallest one. To investigate the strength of polarization for each sample, the representative local hysteresis loops from the each region of the samples are shown in FIG. 4 (d). As shown in FIG. 4 (d), sample A has piezoresponse hysteresis loops 6 times higher than those of sample C and 3 times higher than those of sample B, which is consistent with the orientation of the films and the data shown in FIG. 3. The well-saturated hysteresis loops were observed with the range of ±10 V, which suggests that the switching process is complete. Some of the hysteresis loops for sample A show slight shifts along the vertical axis, resulting from a weak frozen polarization in a certain area.

All the $BiFeO_3$ films exhibited excellent polarization and pronounced ferroelectric switching behavior. Quantitative measurements using SS-PFM indicate that the (111)-oriented polycrystalline $BiFeO_3$ film has a strong polarization compared to films of other orientations. The polarization manipulation of such $BiFeO_3$ films by orientation control, and the excellent ferroelectric properties produced on low-cost, wide-area, flexible substrates, provide for applications such as high-density flexible data storages and non-volatile memories.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof. The disclosures of all of the patent and non-patent references cited herein are hereby incorporated fully by reference in their entireties.

REFERENCES

J. Wang, J. B. Neaton, H. Zheng, V. Nagarajan, S. B. Ogale, B. Liu, D. Viehland, V. Vaithyanathan, D. G. Schlom, U. V. Waghmare, N. A. Spaldin, K. M. Rabe, M. Wuttig, R. Ramesh, Science 299, 1719 (2003).
D. Lebeugle, D. Colson, A. Forget, and M. Viret, Appl. Phys. Lett. 91, 022907 (2007).
J. Li, J. Wang, M. Wuttig, R. Ramesh, N. Wang, B. Ruette, A. P. Pyatakov, A. K. Zvezdin, and D. Viehland, Appl. Phys. Lett. 84, 5261 (2004).
S. K. Singh, Y. K. Kim, H. Funakubo, and H. Ishiwara, Appl. Phys. Lett. 88, 162904 (2006).
H. Bea, M. Bibes, X.-H. Zhu, S. Fusil, K. Bouzehouane, S. Petit, J. Kreisel, and A. Barthelemy, Appl. Phys. Lett. 93, 072901 (2008).
C. C. Lee, J. M. Wu, and C. P. Hsiung, Appl. Phys. Lett. 90, 182909 (2007).
J. T. Dawley and P. G. Clem, Appl. Phys. Lett. 81, 3028 (2002).
J. Ihlefeld, B. Laughlin, A. Hunt-Lowery, W. Borland, A. Kingon, and J.-P. Maria, J. Electroceram. 14, 95 (2005).
A. I. Kingon and S. Srinivasan, Nat. Mater. 4, 233 (2005).
J. Shin, A. Goyal, S. Jesse, and D. H. Kim, Appl. Phys. Lett. 94, 252903 (2009).
A. Goyal (Ed.), Second Generation HTS Conductors, Kluwer Academic Publishers, Massachusetts, 2005, p. 29.
A. Goyal, D. P. Norton, J. D. Budai, M. Paranthaman, E. D. Specht, D. M. Kroeger, D. K. Christen, Q. He, B. Saffian, F. A. List, D. F. Lee, P. M. Martin, C. E. Klabunde, E. Hartfield, and V. K. Sikka, Appl. Phys. Lett. 69 (1996) 1795.
M. Dekkers, M. D. Nguyen, R. Steenwelle, P. M. to Riele, D. H. A. Blank, and G. Rijnders, Appl. Phys. Lett. 95, 012902 (2009).
M. P. Paranthaman, T. Aytug, H. Y. Zhai, L. Heatherly, A. Goyal, and D. K. Christen, Supercond. Sci. Technol. 18, 223 (2005).
S. Jesse, A. P. Baddorf, and S. V. Kalinin, Appl. Phys. Lett. 88, 062908 (2006).
S. V. Kalinin, S. Jesse, B. J. Rodriguez, E. A. Eliseev, V. Gopalan, and A. N. Morozovska, Appl. Phys. Lett. 90, 212905 (2007).

We claim:

1. A polycrystalline multiferroic device article comprising:
   a. a substrate having a biaxially textured surface;
   b. a biaxially textured buffer layer supported by and in contact with the substrate; and,
   c. a biaxially textured, multiferroic device layer supported by and in contact with the buffer layer.

2. The device article of claim 1, wherein the biaxially textured multiferroic device layer comprises at least one selected from the group consisting of multiferroic rare-earth manganites and ferrites and bismuth ferrites and manganites.

3. The device article of claim 1, wherein the biaxially textured multiferroic device layer comprises at least one selected from the group consisting of $TbMnO_3$, $HoMn_2O_5$, $LuFe_2O_4$, $BiFeO_3$ and $BiMnO_3$.

4. The device article of claim 1, further comprising a conducting layer in contact with the biaxially textured multiferroic device layer.

5. The device article of claim 4, wherein the conducting layer is $SrRuO_3$.

6. The device article of claim 1, wherein the orientation of the multiferroic device layer is selected from the group consisting of (111), (101), and (001).

7. The device article of claim 1, wherein the buffer layer comprises $Y_2O_3$.

8. The device article of claim 7, wherein the buffer layer further comprises a YSZ layer on the $Y_2O_3$ layer.

9. The device article of claim 8, wherein the buffer layer further comprises a $CeO_2$ layer on the YSZ layer.

10. The device article of claim 9, wherein the buffer layer further comprises a $BiFeO_3$ seed layer on the $CeO_2$ layer.

11. The device article of claim 1, wherein the buffer layer comprises MgO.

12. The device article of claim 1, wherein the article is selected from the group consisting of a high-density flexible data storage device, an actuator, a switch, and a magnetic field sensor.

13. The device article of claim 1, wherein the article is a non-volatile memory device.

14. The device article of claim 1, wherein said substrate is a RABiTS.

15. The device article of claim 1, wherein said substrate is an ion beam assisted deposition (IBAD) substrate.

16. The device article of claim 1, wherein the substrate is an inclined-substrate deposition (ISD) substrate.

17. A method for making a polycrystalline multiferroic oxide article comprising:
   a. a substrate having a biaxially textured surface;
   b. a biaxially textured buffer layer supported by and in contact with the substrate; and,
   c. a biaxially textured, multiferroic device layer supported by and in contact with the buffer layer,
   the method comprising the steps of:
   a. providing a substrate having a biaxially textured surface;
   b. depositing at least one biaxially textured buffer layer such that the buffer layer is supported by the substrate; and,
   c. depositing a biaxially textured multiferroic oxide layer so as to be supported on the buffer layer.

18. The method of claim 17, wherein the biaxially textured multiferroic oxide layer comprises at least one selected from the group consisting of multiferroic rare-earth manganites and ferrites and bismuth ferrites and manganites.

19. The method of claim 17, wherein the biaxially textured multiferroic oxide layer comprises at least one selected from the group consisting of TbMnO$_3$, HoMn$_2$O$_5$, LuFe$_2$O$_4$, BiFeO$_3$ and BiMnO$_3$.

20. The method of claim 17, further comprising the step of depositing a conducting layer that is in contact with the multiferroic oxide layer.

21. The method of claim 17, wherein the conducting layer is supported by the multiferroic oxide layer.

22. The method of claim 21, wherein the conducting layer is SrRuO$_3$.

23. The method of claim 17, wherein the substrate is formed by a RABiTS process.

24. The method of claim 17, wherein the substrate is formed by ion beam assisted deposition (IBAD) process.

25. The method of claim 17, wherein the substrate is formed by inclined-substrate deposition (ISD) process.

26. The method of claim 17, wherein an SrRuO$_3$ layer is deposited such that the SrRuO$_3$ is supported by the buffer layer; and depositing a top layer of biaxially textured BiFeO$_3$ such that the BiFeO$_3$ is supported by the SrRuO$_3$ layer.

27. A polycrystalline multiferroic device article comprising:
   a. a substrate having a biaxially textured surface;
   b. a set of (100) oriented, biaxially textured buffer layer(s) supported by and in contact with the substrate selected from a group comprising Y$_2$O$_3$, YSZ, CeO$_2$, MgO, SrRuO$_3$; and,
   c. a (100), biaxially textured, multiferroic device layer supported by and in contact with the buffer layer(s) selected from a group comprising BaTiO$_3$, PbTiO$_3$, (PZT), and (PLZT), (PMN), KNbO$_3$, K$_x$Na$_{1-x}$NbO$_3$, and K(Ta$_x$Nb$_{1-x}$)O$_3$, TbMnO$_3$, HoMn$_2$O$_5$, LuFe$_2$O$_4$, BiFeO$_3$ and BiMnO$_3$.

28. A polycrystalline multiferroic device article comprising:
   a. a substrate having a biaxially textured surface;
   b. a set of (100) oriented, biaxially textured buffer layer(s) supported by and in contact with the substrate selected from a group comprising Y$_2$O$_3$, YSZ, CeO$_2$, MgO, SrRuO$_3$; and,
   c. a (110), uniaxially oriented, multiferroic device layer supported by and in contact with the buffer layer(s) selected from a group comprising BaTiO$_3$, PbTiO$_3$, (PZT), and (PLZT), (PMN), KNbO$_3$, K$_x$Na$_{1-x}$NbO$_3$, and K(Ta$_x$Nb$_{1-x}$)O$_3$, TbMnO$_3$, HoMn$_2$O$_5$, LuFe$_2$O$_4$, BiFeO$_3$ and BiMnO$_3$.

29. A polycrystalline multiferroic device article comprising:
   a. a substrate having a biaxially textured surface;
   b. a set of biaxially textured buffer layer(s) supported by and in contact with the substrate selected from a group comprising Y$_2$O$_3$, YSZ, CeO$_2$, MgO, SrRuO$_3$; and,
   c. a (111), uniaxially oriented, multiferroic device layer supported by and in contact with the buffer layer(s) selected from a group comprising BaTiO$_3$, PbTiO$_3$, (PZT), and (PLZT), (PMN), KNbO$_3$, K$_x$Na$_{1-x}$NbO$_3$, and K(Ta$_x$Nb$_{1-x}$)O$_3$, TbMnO$_3$, HoMn$_2$O$_5$, LuFe$_2$O$_4$, BiFeO$_3$ and BiMnO$_3$.

30. A polycrystalline multiferroic device article comprising:
   a. a substrate having a biaxially textured surface;
   b. a set of (100) oriented, biaxially textured buffer layer(s) supported by and in contact with the substrate selected from a group comprising Y$_2$O$_3$, YSZ, CeO$_2$, MgO, SrRuO$_3$; and,
   c. a (100), biaxially textured, BiFeO$_3$ multiferroic device layer supported by and in contact with the buffer layer(s);
   d. said BiFeO$_3$ layer having a similar in-plane and out-of-plane polarization.

31. A polycrystalline multiferroic device article comprising:
   a. a substrate having a biaxially textured surface;
   b. a set of (100) oriented, biaxially textured buffer layer(s) supported by and in contact with the substrate selected from a group comprising Y$_2$O$_3$, YSZ, CeO$_2$, MgO, SrRuO$_3$; and,
   c. a (110), biaxially textured, BiFeO$_3$ multiferroic device layer supported by and in contact with the buffer layer(s);
   d. said BiFeO$_3$ layer having a higher out-of-plane polarization that the in-plane polarization.

32. A polycrystalline multiferroic device article comprising:
   a. a substrate having a biaxially textured surface;
   b. a set of (100) oriented, biaxially textured buffer layer(s) supported by and in contact with the substrate selected from a group comprising Y$_2$O$_3$, YSZ, CeO$_2$, MgO, SrRuO$_3$; and,
   c. a (111), biaxially textured, BiFeO$_3$ multiferroic device layer supported by and in contact with the buffer layer(s);
   d. said BiFeO$_3$ layer having no in-plane polarization and a very high out-of-plane polarization.

* * * * *